United States Patent
Furuse et al.

(10) Patent No.: US 12,142,888 B2
(45) Date of Patent: Nov. 12, 2024

(54) JOINED BODY, LASER OSCILLATOR, LASER AMPLIFIER, AND JOINED BODY MANUFACTURING METHOD

(71) Applicants: National University Corporation Kitami Institute of Technology, Hokkaido (JP); Inter-University Research Institute Corporation National Institutes of Natural Sciences, Tokyo (JP)

(72) Inventors: Hiroaki Furuse, Hokkaido (JP); Yuki Koike, Hokkaido (JP); Ryo Yasuhara, Gifu (JP)

(73) Assignees: National Institute for Materials Science, Ibaraki (JP); Inter-University Research Institute Corporation National Institutes of Natural Sciences, Tokyo (JP)

( * ) Notice: Subject to any disclaimer, the term of this patent is extended or adjusted under 35 U.S.C. 154(b) by 963 days.

(21) Appl. No.: 17/050,433

(22) PCT Filed: Apr. 24, 2019

(86) PCT No.: PCT/JP2019/017503
§ 371 (c)(1),
(2) Date: Jan. 11, 2021

(87) PCT Pub. No.: WO2019/208658
PCT Pub. Date: Oct. 31, 2019

(65) Prior Publication Data
US 2021/0296840 A1    Sep. 23, 2021

(30) Foreign Application Priority Data
Apr. 25, 2018   (JP) .................................. 2018-083878

(51) Int. Cl.
*H01S 3/04*   (2006.01)
*C30B 29/04*   (2006.01)
(Continued)

(52) U.S. Cl.
CPC ............ *H01S 3/0401* (2013.01); *C30B 29/04* (2013.01); *C30B 29/06* (2013.01); *C30B 29/28* (2013.01);
(Continued)

(58) Field of Classification Search
CPC ...................................................... H01S 3/0401
(Continued)

(56) References Cited

U.S. PATENT DOCUMENTS 5,441,803 A * 8/1995 Meissner .............. H01S 3/0625
156/60
5,846,638 A * 12/1998 Meissner ................ B32B 37/00
438/455
(Continued)

FOREIGN PATENT DOCUMENTS

EP    3 557 293 A1   10/2019
JP    2005-262244 A   9/2005
(Continued)

OTHER PUBLICATIONS

Extended European Search Report dated Jan. 4, 2022 issued by the European Patent Office in related European Patent Application No. 19791851.9.
(Continued)

*Primary Examiner* — Tuan N Nguyen
(74) *Attorney, Agent, or Firm* — Gordon Rees Scully & Mansukhani, LLP

(57) ABSTRACT

A joined body (10) includes an optical material (11) and a cooling material (12) that are capable of transmitting light and are joined together. At a joining interface between the
(Continued)

optical material (11) and the cooling material (12), the joined body (10) is capable of transmitting light, and also an atom contained in the optical material (11) diffusively enters the cooling material (12) in such a degree that an interference fringe is not generated in the joined body (10). A diffusive entry length of an atom contained in the optical material (11) into the cooling material (12) may be in a range from approximately 1.0 nm to approximately 10 μm.

14 Claims, 16 Drawing Sheets

(51) Int. Cl.
  *C30B 29/06* (2006.01)
  *C30B 29/28* (2006.01)
  *C30B 29/36* (2006.01)
  *C30B 29/40* (2006.01)
  *C30B 33/06* (2006.01)
  *H01S 3/067* (2006.01)

(52) U.S. Cl.
  CPC ............ *C30B 29/36* (2013.01); *C30B 29/406* (2013.01); *C30B 33/06* (2013.01); *H01S 3/06754* (2013.01)

(58) Field of Classification Search
  USPC .......................................................... 372/34
  See application file for complete search history.

(56) References Cited

U.S. PATENT DOCUMENTS

| 2004/0013151 | A1 | 1/2004 | Sumida et al. |
| 2005/0276300 | A1* | 12/2005 | Ishizu ................. H01S 3/094 |
| | | | 372/75 |
| 2006/0182162 | A1 | 8/2006 | Yanagisawa et al. |
| 2006/0227829 | A1 | 10/2006 | Ushinsky et al. |
| 2008/0298407 | A1 | 12/2008 | Ikesue |
| 2013/0039372 | A1* | 2/2013 | Wakabayashi ........ H01S 3/2251 |
| | | | 372/21 |
| 2016/0087396 | A1 | 3/2016 | Shohda et al. |
| 2017/0330636 | A1 | 11/2017 | Sekine et al. |
| 2017/0358898 | A1 | 12/2017 | Taira et al. |
| 2019/0309936 | A1 | 10/2019 | Kondo et al. |

FOREIGN PATENT DOCUMENTS

| JP | 2010-272712 A | 12/2010 |
| JP | 2016-100359 A | 5/2016 |
| JP | 2016-157905 A | 9/2016 |
| JP | 2017-220652 A | 12/2017 |
| WO | 2005/011075 A1 | 9/2006 |
| WO | 2014/196062 A1 | 12/2014 |
| WO | 2018/110316 A1 | 6/2018 |

OTHER PUBLICATIONS

Kana Fujioka et al.; "Ion Diffusion at the Bonding Interface of Undoped YAG/Yb:YAG Composite Ceramics"; Optical Materials; vol. 46; (2015); Journal Homepage www.elsevier.com/locate/optmat; pp. 542-547.

Hiroaki Furuse et al.; "Sapphire/Nd:YAG Composite by Pulsed Electric Current Bonding for High-Average-Power Lasers"; Optical Letters; vol. 43; No. 13; Jun. 20, 2018; pp. 3065-3068.

S. Tokita et al.; "Sapphire-conductive end-cooling of high power cryogenic Yb:YAG Lasers"; Applied Physics B; vol. 80; pp. 635-638; Mar. 17, 2005.

* cited by examiner

FIG.8

|  | TEMPERATURE [° C] | PRESSURE [MPa] |
|---|---|---|
| SAMPLE 1 | 1100 | 36 |
| SAMPLE 2 | 1200 | 12 |
| SAMPLE 3 | 1100 | 62 |
| SAMPLE 4 | 1200 | 36 |

JOINED BODY, LASER OSCILLATOR, LASER AMPLIFIER, AND JOINED BODY MANUFACTURING METHOD

TECHNICAL FIELD

The present disclosure relates to a joined body, a laser oscillator, a laser amplifier, and a joined body manufacturing method.

BACKGROUND ART

In recent years, with increase in output power of a laser oscillator, cooling of an optical material used in the laser oscillator has become a problem. A temperature gradient generated in an optical material causes a thermal lens effect, thermal aberration, thermal birefringence, and the like. As a result, the temperature gradient degrades quality of laser light. Therefore it is desired to make the temperature gradient in the optical material as gentle as possible. Accordingly, development of techniques for efficiently cooling an optical material in a laser oscillator is underway. For example, Non Patent Literature 1 discloses a bonded body in which transparent sapphire (a cooling material) having excellent thermal conductivity is bonded at both ends of Yb:YAG (an optical material).

CITATION LIST

Non Patent Literature

Non Patent Literature 1: S. TOKITA, APPL. PHYS. B: LASERS AND OPTICS, 80, 635, 2005

SUMMARY OF INVENTION

Technical Problem

It is known that when light enters an interface where substances having different refractive indices come in contact with each other, part of the light is reflected from the interface (Fresnel reflection). The bonded body in Non Patent Literature 1 is formed by bonding an optical material to a cooling material and therefore has a problem that an amount of loss caused by a Fresnel reflection is large when light is transmitted through the bonded body. Such a problem exists not only in a case of causing a bonded body formed by bonding Yb:YAG to sapphire to transmit light but also in a case of causing a composite material formed by combining materials capable of transmitting light to transmit light.

The present disclosure has been made based on such a background, and an objective of the disclosure is to provide a joined body, a laser oscillator, a laser amplifier, and a joined body manufacturing method that provide sufficient optical quality even when materials capable of transmitting light are combined.

Solution to Problem

In order to achieve the aforementioned objective, a joined body according to a first aspect of the present disclosure includes a first material and a second material that are capable of transmitting light and are joined together, wherein, at a joining interface between the first material and the second material, the joined body is capable of transmitting light, and also an atom contained in the first material diffusively enters the second material in such a degree that an interference fringe is not generated in the joined body.

A diffusive entry length of an atom contained in the first material into the second material may be in a range from approximately 1.0 nm to approximately 10 μm.

Assuming a wavelength λ of laser light emitted from a laser interferometer used for measuring transmission wave surface precision to be 633 nm, transmission wave surface precision of the first material and the second material may be approximately λ or less.

The first material may be a polycrystal, and the second material may be a monocrystal.

The polycrystal may be YAG or YAG doped with a rare-earth ion, and the monocrystal may be sapphire, aluminum nitride, gallium nitride, silicon carbide, or diamond.

The first material may be a phosphor or a magneto-optical material, and the second material may be a material having a thermal conductivity higher than that of the first material.

In order to achieve the aforementioned objective, a laser oscillator according to a second aspect of the present disclosure includes:

the joined body;
a resonator being placed in such a way as to sandwich the joined body and resonating light pumped by the joined body; and
a pumping light source emitting light to the joined body in such a way as to pump the joined body.

In order to achieve the aforementioned objective, a laser amplifier according to a third aspect of the present disclosure includes:

the joined body;
a pumping light source emitting light to the joined body in such a way as to pump the joined body; and
an amplified light source introducing light to the joined body in such a way that the light is amplified by the joined body.

In order to achieve the aforementioned objective, a joined body manufacturing method according to a fourth aspect of the present disclosure is a method for manufacturing a joined body including a first material and a second material that are capable of transmitting light and are joined together, the joined body manufacturing method including:
a step of laying the first material and the second material on top of each other;
a step of pressurizing the first material and the second material at a predetermined pressure in such a way that the first material and the second material are closely adhered to each other;
a step of heating the first material and the second material to a predetermined temperature by supplying pulse current to the pressurized first material and the pressurized second material;
a step of, for a predetermined time, maintaining pressure applied to the first material and the second material at a predetermined pressure and maintaining temperature of the first material and the second material at a predetermined temperature; and
a step of gradually decreasing pressure applied to the first material and the second material, and temperature of the first material and the second material.

The predetermined pressure may be in a range from approximately 1 MPa to approximately 10 GPa.

The predetermined temperature may be in a range from approximately 900° C. to approximately 1500° C.

The predetermined time may be in a range from approximately 5 minutes to approximately 20 hours.

Advantageous Effects of Invention

The present disclosure can provide a joined body, a laser oscillator, a laser amplifier, and a joined body manufacturing method that provide sufficient optical quality even when materials capable of transmitting light are combined.

BRIEF DESCRIPTION OF DRAWINGS

FIG. 8 is a diagram indicating experimental conditions in Example 1;

DESCRIPTION OF EMBODIMENTS

Embodiments of a joined body, a laser oscillator, a laser amplifier, and a joined body manufacturing method according to the present disclosure will be described in detail below with reference to drawings. In each drawing, the same sign is given to the same or equivalent parts.

Embodiment 1

Figure 1:
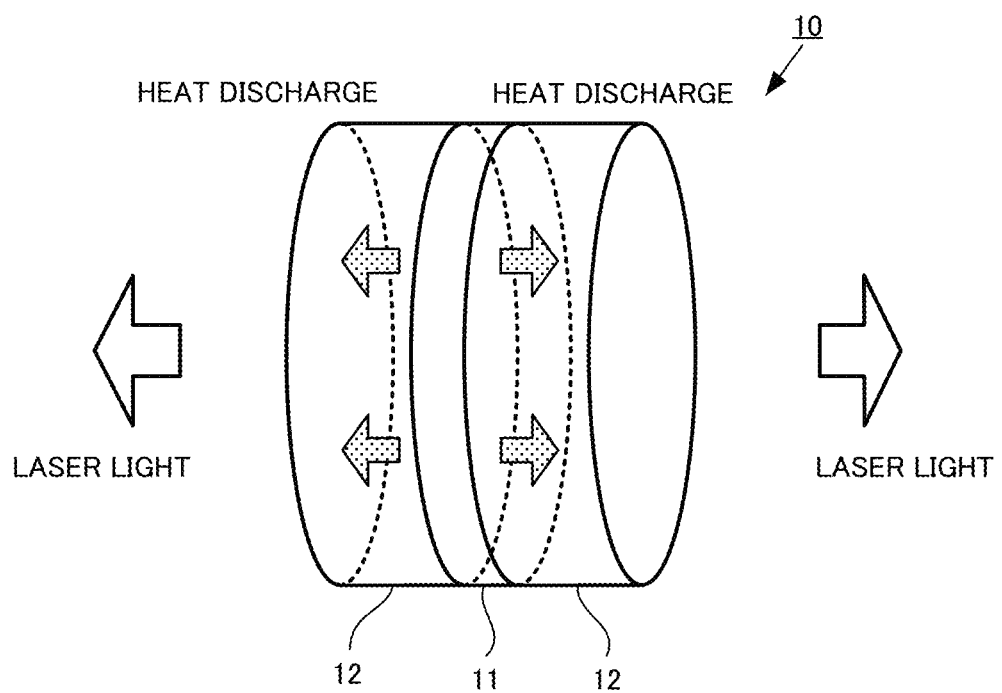
FIG. 1 is a perspective view illustrating a joined body according to Embodiment 1 of the present disclosure.

FIG. 1 is a perspective view illustrating a structure of a joined body 10 according to Embodiment 1. The joined body 10 includes an optical material 11 (first material) and a pair of cooling materials 12 (second materials) each of which is joined to each of the two ends of the optical material 11. Each of the optical material 11 and the cooling material 12 is formed of a material capable of transmitting light and, more specifically, is formed of a transparent material. The optical material 11 and the cooling material 12 are joined to each other without involving means for bonding materials, such as an adhesive.

"Joining" means binding materials in contact with each other by diffusive entry of atoms from at least one of the materials to the other material. "Joining" does not include a case of binding materials by involving means for bonding the materials, such as an adhesive. At a joining interface in the joined body 10, part of atoms of the optical material 11 diffusively enter the cooling material 12, or part of atoms of the cooling material 12 diffusively enter the optical material 11. Consequently, the optical material 11 is firmly joined to the cooling material 12.

Further, "joining" also includes a case of, when atoms diffusively enter from one material to another material, an intermediate layer originating in the atoms constituting the materials being formed between the materials in contact with each other and the materials being bound through the intermediate layer. Further, it is also included that a case of placing an intermediate layer (such as a $SiO_2$ layer) causing diffusion and entry of atoms with one material and the other material between the one material and the other material, and binding the materials through the intermediate layer.

For example, each of the optical material 11 and the cooling material 12 is disk-shaped and is formed at the same outer diameter. By using a manufacturing method of the joined body 10 to be described later, an unprecedentedly large-sized joined body 10 can be produced. The outer diameter of the joined body 10 may be approximately 10 mm or greater, may be, for example, approximately 0.5 mm to approximately 300 mm, and may preferably be approximately 10 mm to approximately 100 mm. Further, when defined by an area, for example, the size of the joined body 10 may be in a range from approximately 100 $mm^2$ to 1.0 $m^2$.

The optical material 11 is a laser medium in a laser oscillator. The laser medium amplifies light by absorbing light emitted from a pumping light source and causing induced emission. The laser medium is formed of a phosphor absorbing light at a specific wavelength and emitting light at another wavelength based on the specific wavelength.

For example, the optical material 11 is a polycrystal such as yttrium aluminum garnet (YAG) or Nd:YAG. Nd:YAG is in a same material type relation with YAG and is acquired by doping YAG with neodymium (Nd) and replacing part of yttrium (Y) with neodymium. Polycrystals such as YAG and Nd:YAG have excellent light absorbance. Therefore, increasing in output power of a laser oscillator can be achieved by using the polycrystals. For example, the thickness of the optical material 11 is approximately 0.1 mm to approximately 100 mm.

Further, a polycrystal constituting the optical material 11 may be a material acquired by doping a basic material such as YAG, lutetium aluminum garnet (LuAG), $Y_2O_3$, $Lu_2O_3$, or $CaF_2$ with a rare-earth ion such as Ce, Pr, Nd, Sm, Eu, Tb, Dy, Ho, Er, Tm, or Yb. The basic material may be co-doped with a plurality of types of rare-earth ions.

The cooling material 12 is a material capable of transmitting light, transfers heat generated in the optical material 11, and emits the heat to the outside. In order to efficiently absorb heat generated in the optical material 11, the cooling material 12 is formed of a material having a thermal conductivity higher than that of the optical material 11. For example, the cooling material 12 is a monocrystal such as sapphire, aluminum nitride, gallium nitride, silicon carbide, or diamond. For example, the thickness of the cooling material 12 is approximately 0.1 mm to approximately 100 mm.

Sapphire has a property of having a higher damage threshold value compared with YAG. The damage threshold value is a threshold value of an amount of energy per unit area that can be supplied without damaging the material. By sandwiching the optical material 11 formed of YAG by cooling materials 12 formed of sapphire, damage to the joined body 10 caused by application of energy can be effectively prevented even when the optical material 11 is formed of YAG.

A degree of diffusive entry of atoms at the joining interface in the joined body 10 is evaluated by an index called a "diffusive entry length" including a case of providing an intermediate layer between one material and the other material. For example, a diffusive entry length is expressed by $\sqrt{Dt}$ in a case of fitting, by Equation (1) below, a one-dimensional concentration distribution of atoms acquired when atoms contained in one material of the joined body 10 diffusively enter the other material.

$$C_x = \frac{C_0}{2}\left[1 - \text{erf}\left(\frac{x - x_0}{2\sqrt{Dt}}\right)\right] \qquad (1)$$

Note that $C_x$ denotes concentration (in any units) of the atoms at a distance x, $C_o$ denotes the concentration (in any units) of the atoms at a distance x=0, x denotes a distance (m), $x_0$ denotes a distance (m) of a position where the concentration of the atoms is $C_0/2$, D denotes a diffusion coefficient (m²/sec), and t denotes time (sec).

The diffusive entry length of atoms of the joined body 10 is set in such a degree that the optical material 11 and the cooling material 12 are firmly joined together. At the same time, transparency and absorbency of the optical material 11 and the cooling material 12 are not affected. For example, a diffusive entry length of atoms of the joined body 10 satisfying the condition described above is in a range from approximately 1.0 nm to approximately 10 μm and is preferably in a range from approximately 1.0 nm to approximately 1.0 μm. The diffusive entry length of atoms of the joined body 10 may be in a range from approximately 1.0 nm to approximately 100 nm or may be in a range from approximately 1.0 nm to approximately 10 nm.

When the laser oscillator operates at high output power, the central part of the optical material 11 reaches a high temperature, and therefore a temperature gradient is generated in a radial direction. A temperature gradient generated in the optical material 11 causes thermal expansion, a refractive index gradient, and the like. As a result, the temperature gradient causes degradation in beam quality and decrease in laser output. However, the joined body 10 is formed in such a way that the cooling materials 12 arranged in an oscillation direction of laser light sandwich the optical material 11, and therefore heat generated in the central part of the optical material 11 can be efficiently discharged.

As described above, the cooling materials 12 are joined to both ends of the optical material 11 in the joined body 10 according to Embodiment 1, and therefore thermal resistance at the interface is lower compared with a case of bonding the two. Accordingly, heat generated in the optical material 11 can be conducted to the cooling material 12 and can be efficiently discharged to the outside.

Further, the optical material 11 is joined to the cooling material 12 without involving the air, an adhesive, or the like in the joined body 10 according to Embodiment 1, and therefore sufficient optical quality can be acquired by suppressing Fresnel loss and intensity can be sufficiently secured.

Furthermore, the optical material 11 is formed of a polycrystal, and the cooling material 12 is formed of a monocrystal in the joined body 10 according to Embodiment 1. Accordingly, even though the optical material 11 is formed of a polycrystal, damage to the joined body 10 can be prevented by sandwiching the optical material 11 by the cooling materials 12 formed of monocrystals.

Figure 2:
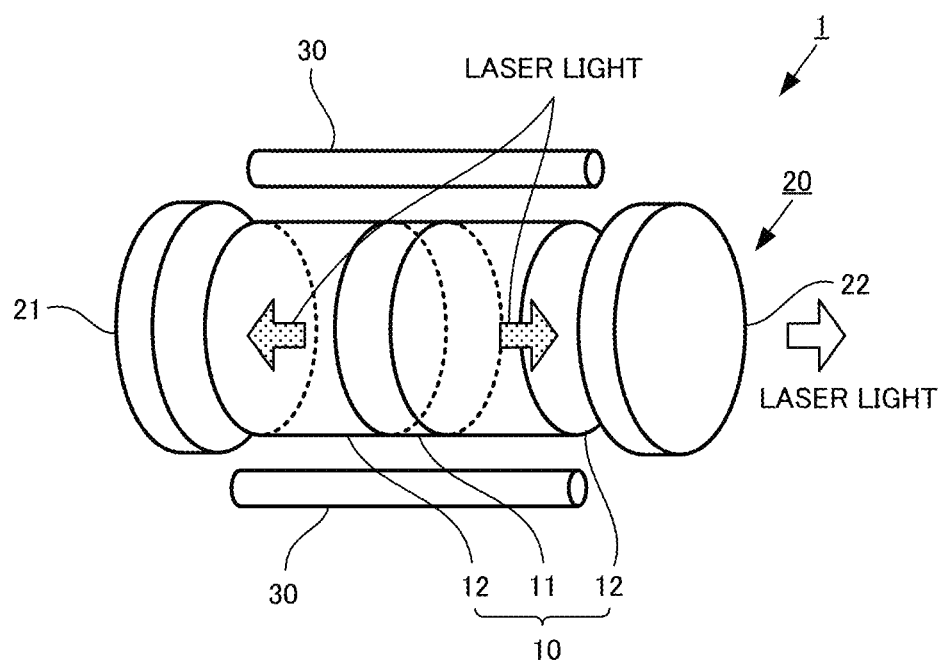
FIG. 2 is a diagram illustrating a structure of a laser oscillator according to Embodiment 1 of the present disclosure.

FIG. 2 is a diagram illustrating a structure of a laser oscillator 1 according to Embodiment 1. The laser oscillator 1 includes a joined body 10 including a laser medium, a resonator 20 placed in such a way as to sandwich the joined body 10, and pumping light sources 30 supplying pumping light to the joined body 10 and causing laser light to resonate in the resonator 20.

The resonator 20 includes a reflecting mirror 21 totally reflecting light and an output mirror 22 capable of taking out part of light to the outside. The reflecting mirror 21 and the output mirror 22 are placed in such a way as to face each other with the joined body 10 in between. Further, the pumping light sources 30 are placed in such a way as to face each other in a radial direction of the joined body 10 with the joined body 10 in between. The laser oscillator 1 amplifies laser light by induced emission every time the laser light passes through the joined body 10, by causing the laser light to repeatedly reflect between the reflecting mirror 21 and the output mirror 22, and emits part of the laser light through the output mirror 22.

The laser oscillator 1 includes the joined body 10 and therefore can efficiently discharge heat generated in the central part of the optical material 11 in a propagation direction of laser light through the cooling material 12. Accordingly, heat can be effectively discharged even when the laser oscillator 1 is downsized, and therefore a small-sized laser device such as a microchip laser can be provided.

Next, a manufacturing method of the joined body 10 will be described with reference to FIG. 3 and FIG. 4. The joined body 10 is manufactured by use of pulsed electric current sintering (PECS). PECS is a method of joining materials to be joined to each other by supplying pulse current generated by ON/OFF switching of direct current and heating the materials while mechanically pressurizing the materials. PECS causes diffusion of atoms between the materials and joins materials to be joined to each other by simultaneously performing pressurization and heating of the materials. PECS causes a punch and a die for pressurizing materials to generate heat and heats the materials by heat conduction of the punch and the die. Therefore PECS allows more rapid heating compared with a case of using an electric furnace or the like. Accordingly, structural change, such as grain growth, occurring due to exposing materials in a high-temperature environment for a long time can be suppressed.

Figure 3:
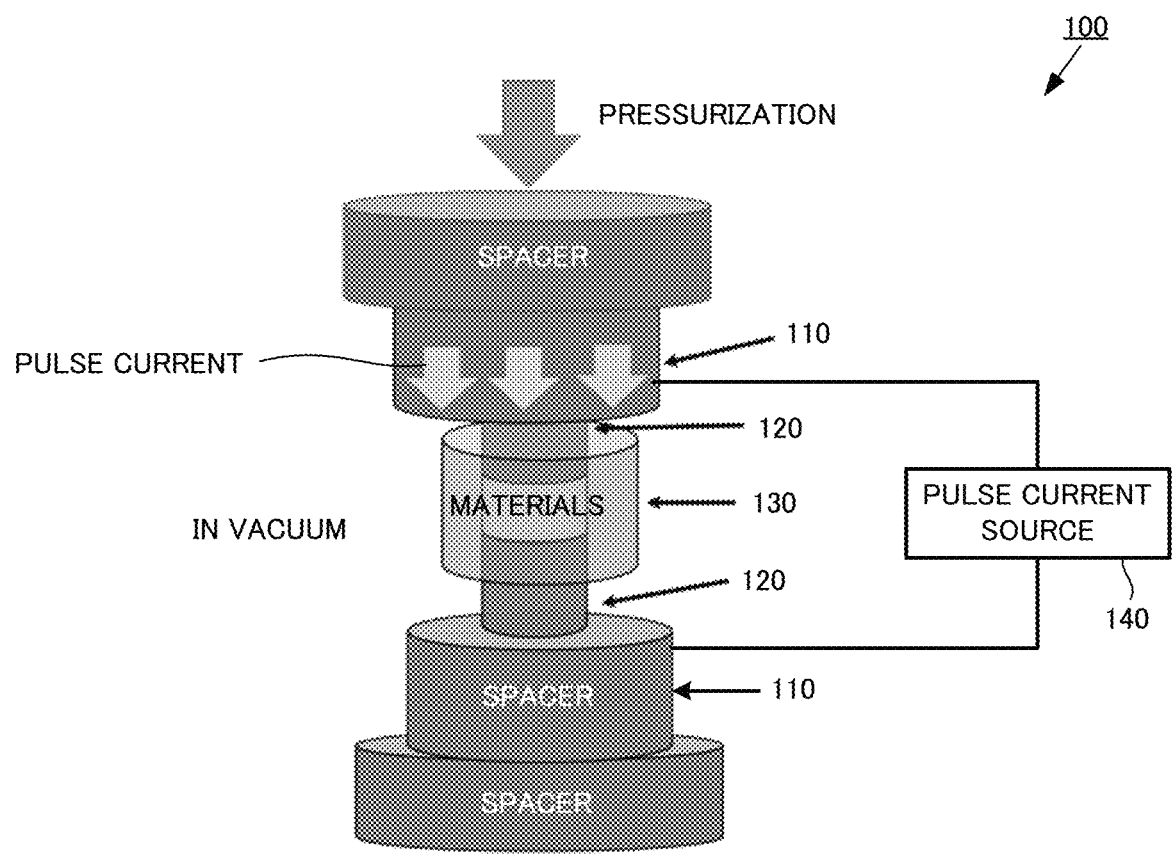
FIG. 3 is a diagram illustrating manufacturing device for the joined body according to Embodiment 1 of the present disclosure.

FIG. 3 is a diagram illustrating a structure of a manufacturing device 100 for manufacturing the joined body 10. The manufacturing device 100 is a device being installed in a vacuum or in an inert gas and manufacturing the joined body 10 by pressurizing materials to be joined and heating the materials by supplying pulse current to the materials.

The manufacturing device 100 includes a pair of vertically placed spacers 110, a pair of punches 120 pressurizing materials to be joined to each other, each punch being fixed at the end of a spacer 110, a die 130 internally housing the pair of punches 120 and the materials, and a pulse current source 140 supplying pulse current from one spacer 110 to the other spacer 110.

The spacer 110 holds the punches 120 and presses the materials from a vertical direction through the punches 120. Further, each spacer 110 is electrically connected to the pulse current source 140 and supplies pulse current from one punch 120 to the other punch 120. The lower spacer 110 is installed on a base of the manufacturing device 100. The upper spacer 110 is fixed to a moving mechanism (unillustrated) of the manufacturing device 100 and is formed in such a way as to be movable in a vertical direction relative to the lower spacer 110.

The punch 120 is a member being in direct contact with a material and pressing the material and at the same time supplying pulse current from the spacer 110 to the material. For example, the punch 120 is a cylindrical member and is formed of an electroconductive material such as graphite. The diameter of the punch 120 corresponds to the diameter of the joined body 10 and, for example, is approximately 0.5 mm to approximately 300 mm and is preferably approximately 10 mm to approximately 100 mm.

The die 130 is a member internally housing materials and supplying pulse current supplied from the punch 120 to the outer peripheral surface of the materials. The die 130 is a tubular member including a through hole being capable of housing materials and allowing the punches 120 to be inserted. For example, the die 130 is formed of an electroconductive material such as graphite. The inside diameter of the die 130 is set in such a way that the outer peripheral surface of the materials and the outer peripheral surface of the punch 120 come in contact with the inner peripheral surface of the die 130.

Figure 4:
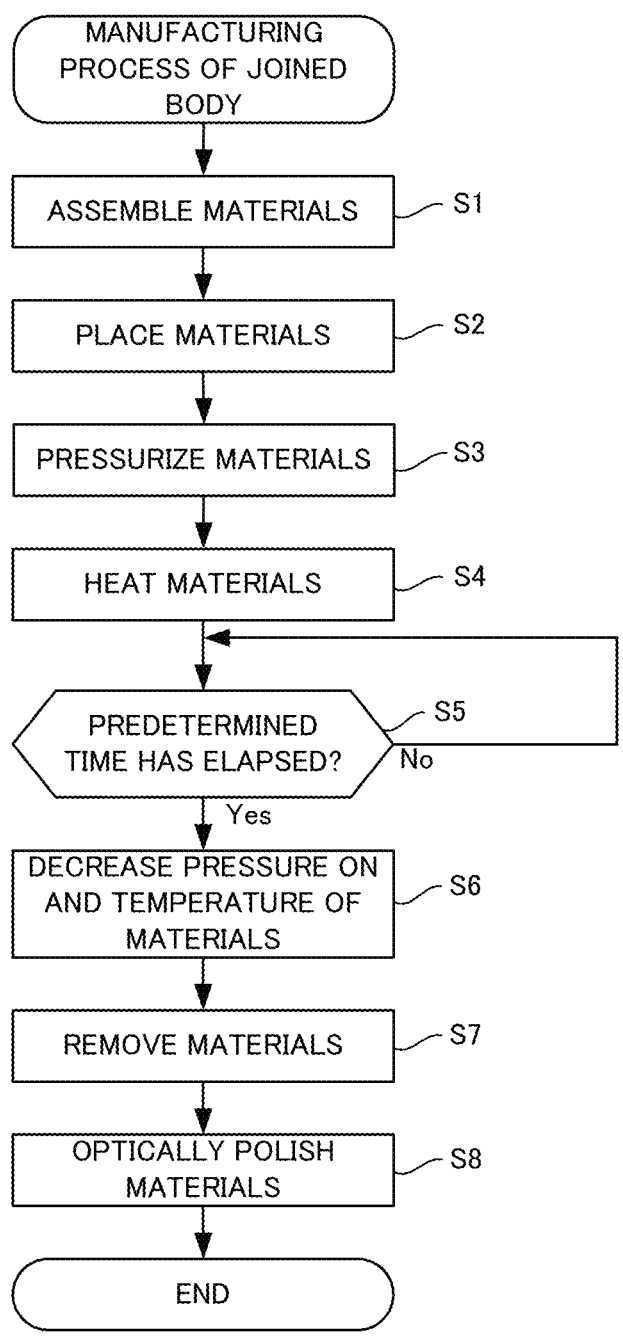
FIG. 4 is a flowchart illustrating a flow of a manufacturing process of the joined body.

FIG. 4 is a flowchart illustrating a flow of a manufacturing process of the joined body 10 manufactured by use of the manufacturing device 100. A flow of the manufacturing process of the joined body 10 will be described below with reference to FIG. 4.

First, an optical material 11 and cooling materials 12 are integrally assembled (Step S1). The optical material 11 and the cooling materials 12 may be integrally assembled by placing a cooling material 12 at each of two ends of the optical material 11 and applying an adhesive to the outer peripheral surface of a part where the optical material 11 is in contact with the cooling material 12. Further, the two may be bonded by bonding surfaces of the optical material 11 and the cooling materials 12 together in an activated state.

The integrally assembled optical material 11 and the cooling materials 12 are formed in such a way as to have predetermined transmission wave surface precision. Assuming a wavelength of laser light emitted from a laser interferometer used for measuring transmission wave surface precision to be $\lambda=633$ nm, for example, the transmission wave surface precision is approximately $\lambda$ or less, is preferably approximately $\lambda/2$ or less, and is more preferably approximately $\lambda/4$ or less. For example, the lower limit of the transmission wave surface precision may be approximately $\lambda/8$ or less.

Next, the materials assembled in Step S1 are placed at a predetermined position in the manufacturing device 100 (Step S2). More specifically, first, the materials are placed inside the through hole of the die 130 in such a way that a direction in which the optical material 11 and the cooling material 12 are laid on top of each other matches an axial direction of the through hole of the die 130. Subsequently, the materials are placed in the manufacturing device 100 by inserting the pair of punches 120 into the through hole of the die 130.

Next, the materials are pressurized at a predetermined pressure by moving the upper spacer 110 downward (Step S3). The materials are pressurized in the direction in which the optical material 11 and the cooling material 12 are laid on top of each other. For example, the predetermined pressure is in a range from approximately 1.0 MPa to approximately 10 GPa, is preferably in a range from approximately 5.0 MPa to approximately 1.0 GPa, and is more preferably in a range from approximately 5.0 MPa to approximately 0.1 GPa.

Next, the materials in a pressurized state are heated to a predetermined temperature by supplying pulse current to the materials (Step S4). More specifically, the punches 120 generate heat by supplying pulse current to the punches 120, the heat is conducted to the materials, and the materials are quickly heated. Consequently, As a reason for that the temperature of the optical material 11 and the cooling material 12 in the pressurized state rises, diffusion of atoms occurs at the joining interface, and therefore joining of the optical material 11 and the cooling material 12 progresses.

For example, the manufacturing device 100 can raise the temperature of the materials at 500° C./min. The predetermined temperature and the temperature rise rate are set in consideration of types, shapes, sizes, a state of the contact surface, and the like of the optical material 11 and the cooling material 12. For example, the predetermined temperature is in a range from approximately 900° C. to approximately 1500° C., is preferably in a range from approximately 1000° C. to approximately 1400° C., and is more preferably in a range from approximately 1100° C. to approximately 1200° C.

After the materials are heated to the predetermined temperature, the state of the materials being pressurized at the predetermined pressure and being heated at the predetermined temperature is continued for a predetermined time. The predetermined time is set in such a way that a desired diffusive entry length is acquired, in consideration of the types, the shapes, the sizes, the state of the contact surface, and the like of the optical material 11 and the cooling material 12. For example, the predetermined time is in a range from approximately 5 minutes to approximately 20 hours and is preferably in a range from approximately 1 hour to approximately 2 hours.

Next, whether the predetermined time has elapsed since a point of the materials reaching the predetermined temperature is determined (Step S5). When the predetermined time has elapsed since the point of the materials reaching the predetermined temperature (Step S5; Yes), the pressure on the materials is gradually decreased and, at the same time, the temperature of the materials is gradually decreased (Step S6). It is preferable in Step S6 to gradually cool and gradually decompress the materials at a predetermined temperature fall rate and at a predetermined decompression rate. The temperature fall rate and the decompression rate are set in consideration of the types, the shapes, the sizes, the state of the contact surface, and the like of the optical material 11 and the cooling material 12.

On the other hand, when the predetermined time has not elapsed since the point of the materials reaching the predetermined temperature (Step S5; No), the pressurization of the material at the predetermined pressure and the heating of the materials at the predetermined temperature are continued until the predetermined period elapses.

Next, the materials cooled in Step S6 are removed from the manufacturing device 100 (Step S7), and by performing optical polishing on the reflection surface of the materials (Step S8), the manufacture of the joined body 10 ends. The above is the flow of the manufacturing process of the joined body 10 using the manufacturing device 100.

Known methods of joining materials together include a thermal diffusion joining method and a normal temperature joining method, and it is conceivable to apply the techniques to the manufacturing process of the joined body 10. However, the thermal diffusion joining method heats materials by use of an electric furnace or the like and therefore requires high-temperature heat treatment for a long time; and it is difficult to make a diffusive entry length of atoms at the joining interface approximately 10 μm or less. Further, thermal expansion occurs in a clamp for pressurizing materials at a high temperature in the thermal diffusion joining method, and therefore it is difficult to control pressure actually applied to the materials. Furthermore, thermal expansion occurs in the materials themselves at a high temperature in the thermal diffusion joining method, and therefore it is difficult to join different types of materials with different thermal expansion coefficients to each other.

The normal temperature joining method requires extremely high surface precision for joining interfaces to each other. More specifically, denoting a wavelength of laser light emitted from a laser interferometer used for measuring transmission wave surface precision by $\lambda$, transmission wave surface precision required of materials is required to be approximately $\lambda/8$ or less. It is difficult to form materials having a wide area with high surface precision, and therefore it is difficult to achieve upsizing of a joined body (such as approximately 100 mm$^2$ or greater) by the normal temperature joining method. Further, the normal temperature joining method does not heat materials, and therefore it is difficult to make a diffusive entry length at a joining interface approximately 1.0 nm or greater. Furthermore, the normal temperature joining method requires a high degree of vacuum, and therefore a manufacturing cost is high.

On the other hand, the manufacturing method according to Embodiment 1 can perform heat treatment on materials in a short period of time by use of pulse current and therefore can easily join the materials together in a short period of time. Further, As a reason for that the manufacturing method according to Embodiment 1 uses pulse current for heating materials, thermal expansion does not occur in the punch 120 and the die 130, and the pressure applied to the materials can be accurately controlled even at a high temperature.

Furthermore, by adjusting a predetermined pressure, a predetermined temperature, and a predetermined time, the manufacturing method according to Embodiment 1 can control a diffusive entry length of atoms at a joining interface of materials to a desired range (such as from approximately 1.0 nm to approximately 10 μm) and can suppress structural change, such as grain growth, in a polycrystal under heat treatment. Moreover, the manufacturing method according to Embodiment 1 can achieve upsizing of the joined body 10 (such as an area of approximately 100 mm$^2$ or greater) since materials can be joined to each other even when transmission wave surface precision at a joining interface is approximately $\lambda$ or less and can suppress a manufacturing cost since a high degree of vacuum is not required.

Embodiment 2

Figure 5:
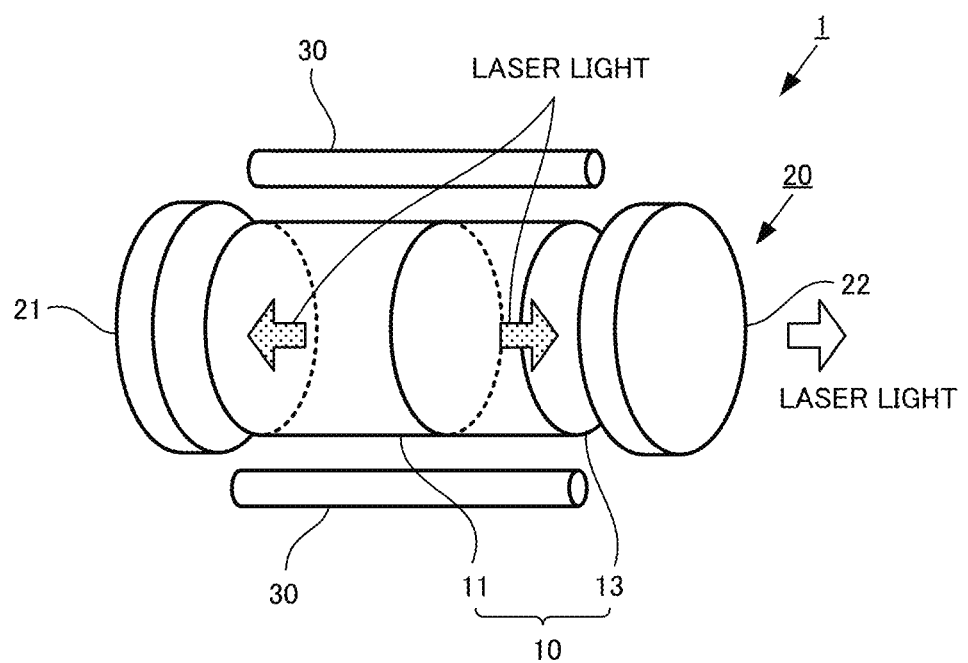
FIG. 5 is a diagram illustrating a structure of a laser oscillator according to Embodiment 2 of the present disclosure.

Structures of a joined body 10 and a laser oscillator 1 according to Embodiment 2 of the present disclosure will be described with reference to FIG. 5. The joined body 10 according to Embodiment 2 differs from the joined body 10 according to Embodiment 1 in joining a saturable absorber 13 (second material) to an optical material 11 (first material).

The joined body 10 includes the optical material 11 being a laser medium and the saturable absorber 13 joined to one surface of the optical material 11. The saturable absorber 13 acts as an absorber for low-intensity incident light and acts as a transparent body for high-intensity incident light by saturation of an ability as an absorber. For example, the saturable absorber 13 is formed of YAG doped with Cr (Cr:YAG).

The laser oscillator 1 includes a reflecting mirror 21 being placed on the optical material 11 side of the joined body 10 and totally reflects laser light, and an output mirror 22 being placed on the opposite side of the reflecting mirror 21 with the joined body 10 in between and partially reflecting laser light. The reflecting mirror 21 and the output mirror 22 constitute a resonator 20 resonating laser light inductively emitted by the joined body 10.

When the saturable absorber 13 is irradiated with a light pulse, the central part of the pulse having high intensity passes through the saturable absorber 13, whereas the foot part of the pulse having low intensity is absorbed by the saturable absorber 13. Accordingly, a pulse width (time duration) of laser light in the laser oscillator 1 becomes shorter, and, for example, a light pulse with a width of the order of picoseconds to nanoseconds is emitted.

As described above, the laser oscillator 1 according to Embodiment 2 includes the saturable absorber 13 joined to the optical material 11. Accordingly, the laser oscillator 1 can provide sufficient optical quality by suppressing Fresnel loss and can achieve pulse shortening of laser light.

Embodiment 3

Figure 6:
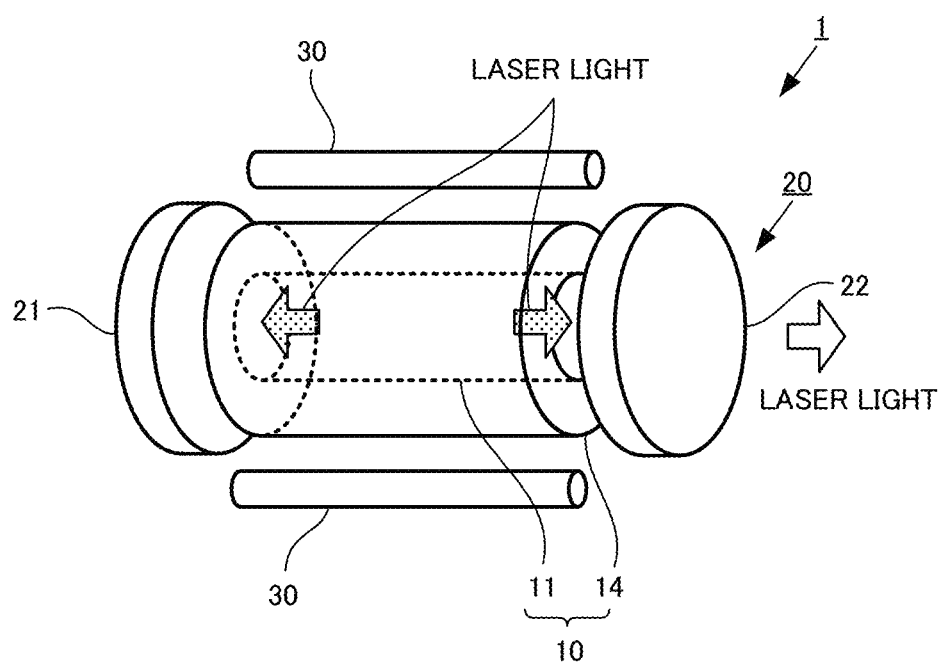
FIG. 6 is a diagram illustrating a structure of a laser oscillator according to Embodiment 3 of the present disclosure.

Structures of a joined body 10 and a laser oscillator 1 according to Embodiment 3 of the present disclosure will be described with reference to FIG. 6. The joined body 10 according to Embodiment 3 differs from the joined bodies 10 according to Embodiments 1 and 2 in joining a spontaneous emission absorber 14 (second material) in such a way that the spontaneous emission absorber 14 surrounds the outer periphery of an optical material 11 (first material).

The joined body 10 includes the optical material 11 being a laser medium and the spontaneous emission absorber 14 being joined around the optical material 11 and absorbing light from the laser medium. For example, the spontaneous emission absorber 14 is formed of Sm:YAG or Cr:YAG.

When pumping energy is supplied to the optical material 11, amplified spontaneous emission (ASE) may be generated. ASE is light generated by spontaneous emission generated in a laser medium propagating through the laser medium. When pumping energy is further supplied, ASE may cause resonance (parasitic oscillation) in a direction other than an oscillation direction of laser light. When ASE and parasitic oscillation are generated, energy used for light amplification is wastefully consumed, and therefore laser output of the laser oscillator 1 decreases.

The spontaneous emission absorber 14 is joined in such a way as to surround the outer periphery of the optical material 11 in the joined body 10 according to Embodiment 3; and therefore spontaneous emission is absorbed by the spontaneous emission absorber 14, and, as a result, ASE and parasitic oscillation are suppressed. Further, the spontaneous emission absorber 14 itself is a non-heat-generating material and therefore can absorb heat generated by the optical material 11 and discharge the heat to the outside.

As described above, the laser oscillator 1 according to Embodiment 3 includes the spontaneous emission absorber 14 joined in such a way as to surround the outer periphery of the optical material 11. Accordingly, even when ASE is generated and light enters the spontaneous emission absorber 14 from the optical material 11, parasitic oscillation can be suppressed, and at the same time, the optical material 11 can be cooled. As a result, decrease in laser output in the laser oscillator 1 can be suppressed.

Embodiment 4

Figure 7:
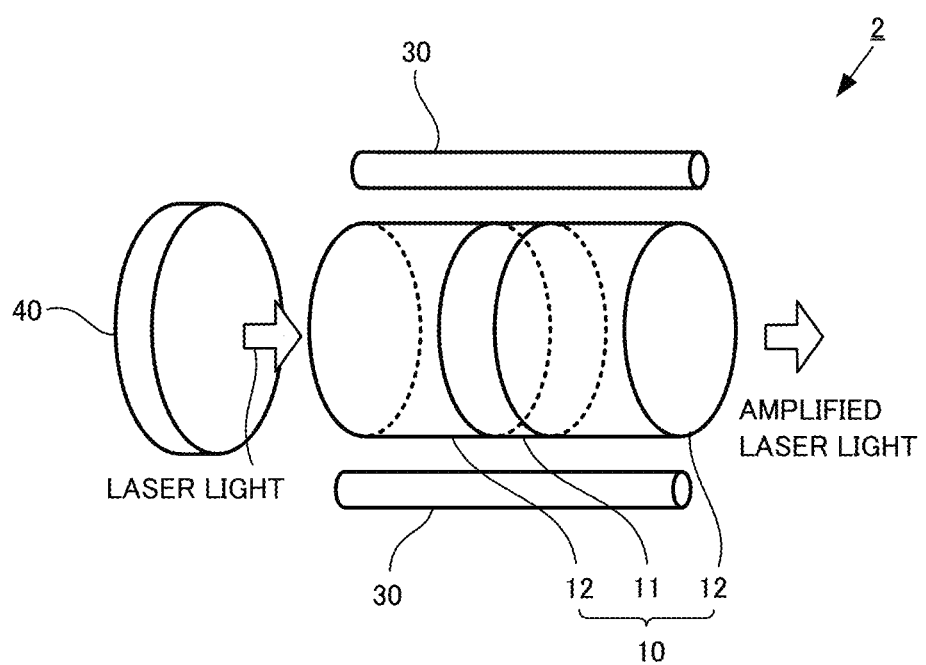
FIG. 7 is a diagram illustrating a structure of a laser amplifier according to Embodiment 4 of the present disclosure.

Structures of a joined body 10 and a laser amplifier 2 according to Embodiment 4 of the present disclosure will be described with reference to FIG. 7. The laser amplifier 2 is a device amplifying laser light entering from the outside with a laser medium and emitting the amplified light to the outside. Unlike the laser oscillators 1 according to Embodiments 1 to 3, the laser amplifier 2 does not include a resonator 20.

The laser amplifier 2 includes the joined body 10, a pumping light source 30, and an amplified light source 40. The pumping light source 30 emits light to the joined body 10 in such a way as to pump the joined body 10. The amplified light source 40 introduces light to the joined body 10 in such a way that the light is amplified by the joined body 10. The light emitted from the amplified light source 40 is amplified by an optical material 11 in the joined body 10 pumped by the pumping light source 30 and is emitted from the joined body 10. At this time, cooling materials 12 are joined to both sides of the optical material 11, and therefore heat generated in the central part of the optical material 11 can be efficiently discharged in a propagation direction of the laser light through the cooling material 12.

As described above, the laser amplifier 2 includes the joined body 10 in which the optical material 11 is joined to the cooling materials 12 and therefore can effectively cool the optical material 11 pumped by the pumping light source 30. Accordingly, heat can be effectively discharged even when the laser amplifier 2 is downsized, and thus downsizing of the laser amplifier 2 can be achieved.

The present disclosure will be specifically described below by citing Examples. However, the present disclosure is not limited to Examples.

Example 1

An experiment performed for evaluating success or failure of joining of a joined body and the result thereof will be described with reference to FIG. 8 and FIG. 9.

In this verification, first, a 1% Nd:YAG polycrystal and a sapphire monocrystal were worked into disk shapes having the same outer diameter. The 1% Nd:YAG polycrystal is acquired by doping YAG with 1% of neodymium. Next, a bonded body was acquired by laying the worked Nd:YAG polycrystal and sapphire monocrystal on top of each other and applying an adhesive to the outer peripheral part.

FIG. 8 indicates conditions for temperature and pressure in PECS for each sample of a joined body. A sample of a joined body (may be hereinafter referred to as an Nd:YAG/sapphire joined body) was produced by processing a bonded body integrated by an adhesive, in accordance with a condition in FIG. 8. Next, success or failure of joining was determined for each produced sample by confirming existence of an interference fringe and measuring a transmission spectrum for each sample.

Figure 9:
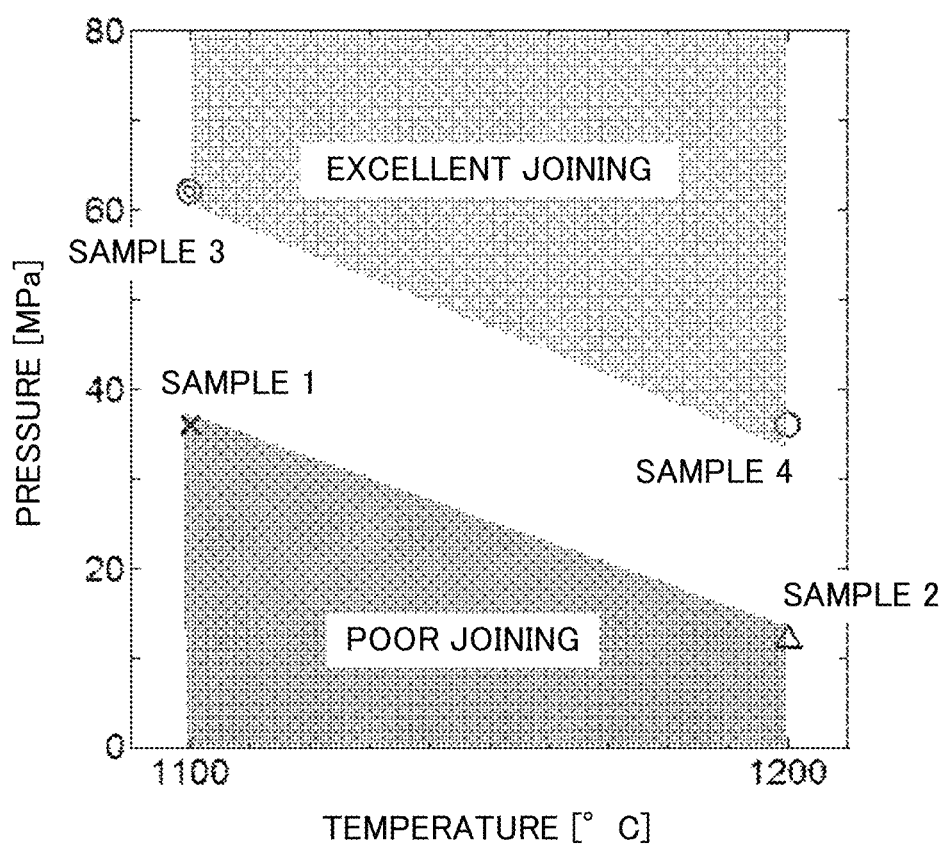
FIG. 9 is a graph for illustrating success or failure of a joined body for each experimental condition in Example 1.

FIG. 9 is a graph for illustrating success or failure of joining in the samples produced under the conditions in FIG. 8. The vertical axis of FIG. 9 represents pressure (MPa) in PECS, and the horizontal axis represents temperature (° C.) in PECS. A symbol × in FIG. 9 represents a sample 1 (1100° C., 36 MPa), a symbol Δ represents a sample 2 (1200° C., 12 MPa), a symbol of "double circle" represents a sample 3 (1100° C., 62 MPa), and a symbol ○ represents a sample 4 (1200° C., 36 MPa). An interference fringe was observed in the entire sample 1. Further, an interference fringe was observed on the periphery of the sample 2 and the sample was slightly blackish. On the other hand, an interference fringe did not exist at all in the sample 3, and the most excellent result was exhibited. Further, while an interference fringe did not exist at all in the sample 4, the sample was slightly blackish.

Accordingly, it is understood that a joined body in an excellent joining state without an interference fringe is acquired when pressure and temperature are in an "excellent joining" region in FIG. 9. A slope of a straight line including a point representing the sample 3 and a point representing the sample 4 in FIG. 9 is (36−62)/(1200−1100)=−0.26, and therefore a condition imposed on pressure P and temperature T for acquiring a joined body without an interference fringe is expressed by Equation (2) below in a range from the temperature T=1100° C. to 1200° C.

$$P \geq -0.26*(T-1100)+62 \quad (2)$$

From the above, it is confirmed in this verification that a joined body in an excellent joining state without an interference fringe is acquired by adjusting temperature and pressure in PECS.

Example 2

Next, an experiment for measuring a transmission spectrum in each sample of an Nd:YAG polycrystal, a bonded body, and a joined body, and the result thereof will be described with reference to FIG. 10. Note that the bonded body is acquired by laying a sapphire monocrystal and an Nd:YAG polycrystal on top of each other and applying an adhesive to the outer peripheral surface, and the joined body is an Nd:YAG/sapphire joined body acquired under the condition of 1100° C. and 62 MPa providing the most excellent result in Example 1.

A transmission spectrum indicates a transmissivity of a sample for each wavelength of incident light entering the sample; and a transmissivity is a ratio of incident light at a specific wavelength transmitted through the sample. Part of incident light entering a sample is reflected from the surface of the sample, the joining interface of materials, and the like. Accordingly, intensity of transmitted light transmitted through the sample decreases compared with that of the incident light entering the sample. In this verification, a transmission spectrum of each sample was generated by measuring a radiant emittance of transmitted light transmitted through each sample and calculating a ratio between radiant emittances of transmitted light and incident light for each wavelength of incident light. Note that a radiant emittance is an emission flux per unit area emitted from an emitter.

Figure 10:
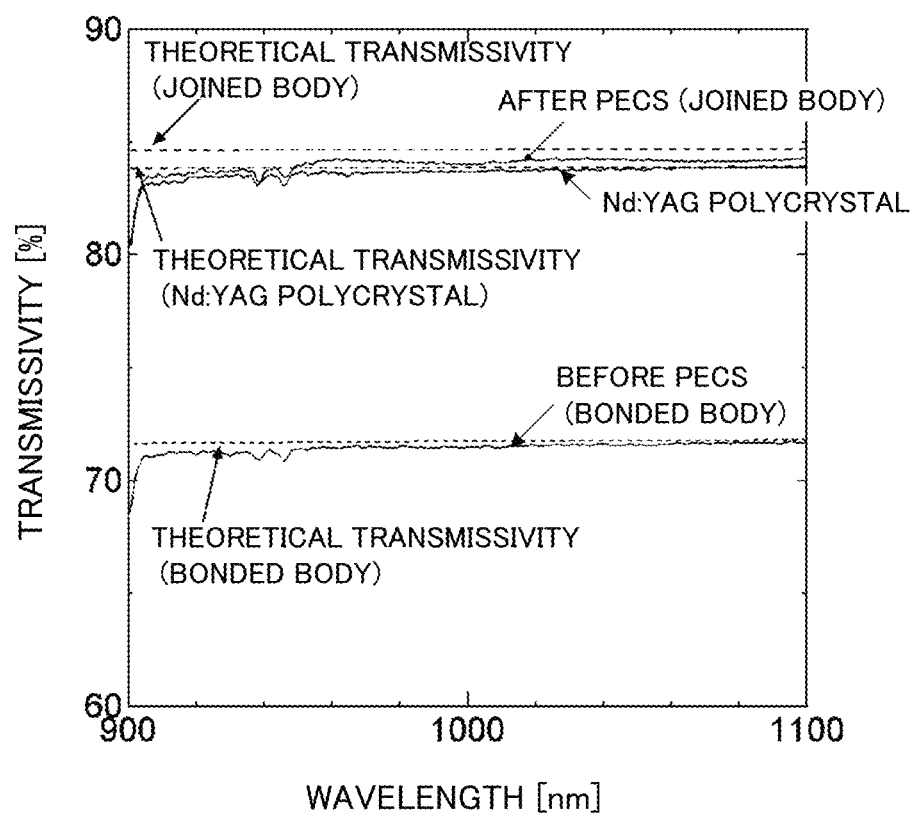
FIG. 10 is a graph illustrating a relation between a wavelength and a transmissivity of incident light in Example 2.

FIG. 10 is a graph illustrating transmission spectra in an Nd:YAG polycrystal, a bonded body, and a joined body. The vertical axis of FIG. 10 represents a transmissivity (%), and the horizontal axis represents a wavelength (nm) of incident light. Further, a solid line in FIG. 10 represents an actually measured transmissivity, and a dotted line represents a theoretical value of transmissivity. As illustrated in FIG. 10, across the entire wavelength range, a transmissivity of the joined body had a value higher than that of the bonded body by approximately 13% and a value higher than that of the Nd:YAG polycrystal. The reason the transmissivity of the joined body was higher than the transmissivities of the bonded body and the Nd:YAG polycrystal is that Fresnel loss was suppressed by a sapphire monocrystal being joined to the Nd:YAG polycrystal. For example, when irradiated with a wavelength of 1064 nm, the transmissivity (experimental value) of the joined body was 84.1%, whereas the transmissivity (experimental value) of the bonded body was 71.6%, and the transmissivity (experimental value) of the Nd:YAG polycrystal was 83.9%. Since the transmissivity (theoretical value) of the joined body was 84.7%, the transmissivity (theoretical value) of the bonded body was 71.8%, and the transmissivity (theoretical value) of the Nd:YAG polycrystal was 83.9%, the experimental result on transmission spectra is confirmed to be valid.

From the above, it is confirmed in this verification that a joined body produced by PECS has a higher transmissivity compared with a bonded body before undergoing PECS and has excellent optical quality.

Example 3

Next, an experiment performed for observing an internal structure of a joined body and the result thereof will be described with reference to FIG. 11 and FIG. 12. In this verification, an image of a joining interface in an Nd:YAG/sapphire joined body produced under a condition of 1100° C. and 62 MPa was captured by a scanning electron microscope (SEM), and the joining interface in the SEM image was observed. Further, an elementary analysis of the Nd:YAG/sapphire joined body was performed by performing a fluorescent X-ray analysis by use of a fluorescent X-ray analysis device.

Figure 11:
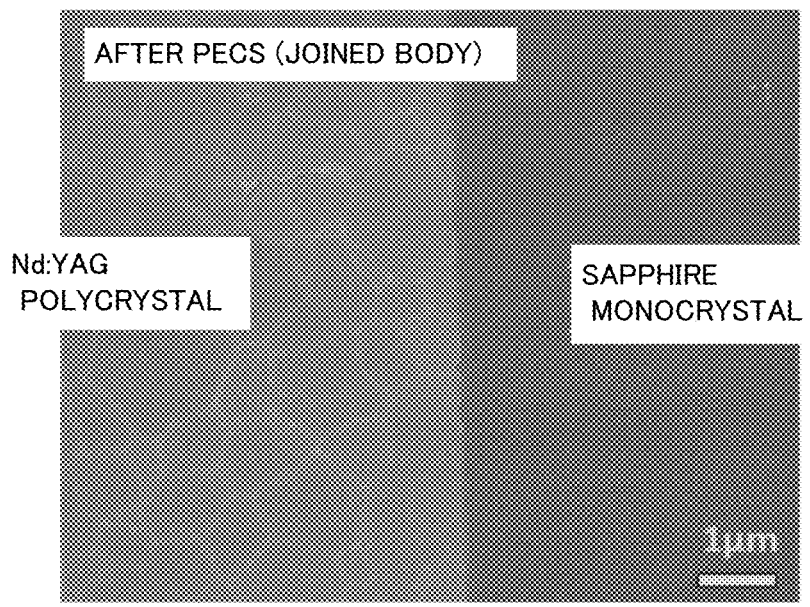
FIG. 11 is a diagram illustrating an SEM image including a joining interface in Example 3.

FIG. 11 is a diagram illustrating an SEM image including the joining interface in the joined body. The left side of FIG. 11 represents an Nd:YAG polycrystal, and the right side represents a sapphire monocrystal. As illustrated in FIG. 11, it is confirmed that there is no space at the joining interface between the sapphire monocrystal and the Nd:YAG polycrystal, and the two are excellently joined together even at a micro level.

Figure 12:
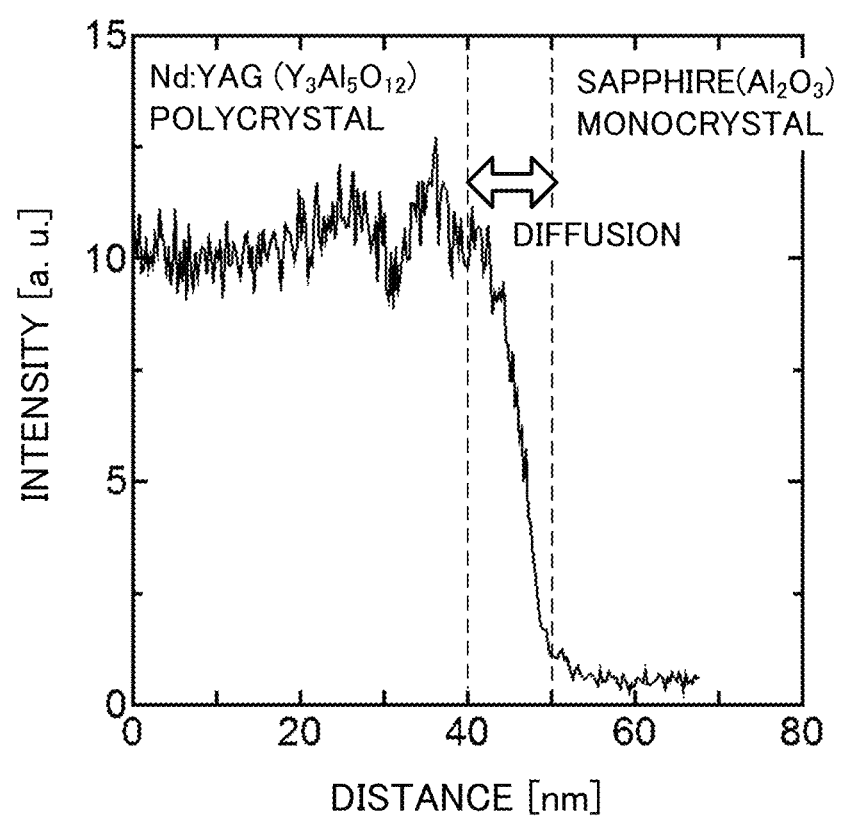
FIG. 12 is a graph illustrating a relation between a distance from a joined body surface and intensity of characteristic X-ray in Example 3.

FIG. 12 is a graph illustrating the result of the elementary analysis in the joined body. The vertical axis of FIG. 12 represents intensity (in any units) of characteristic X-rays, and the horizontal axis represents a distance (nm) from the surface of the Nd:YAG polycrystal. The left side of FIG. 12 represents an Nd:YAG region, the central part represents a region of the interface between Nd:YAG and sapphire, and the right side represents a sapphire monocrystal region. In FIG. 12, a state of a solid line indicating intensity of characteristic X-rays related to yttrium (Y) sloping from upper left toward lower right in the interface region is observed. The above indicates that yttrium contained in the Nd:YAG polycrystal diffusively entered the sapphire monocrystal.

From the above, it is confirmed in this verification that diffusion and entry of yttrium from the Nd:YAG polycrystal to the sapphire monocrystal occur at the joining interface in the joined body acquired by PECS, and at the same time the sapphire monocrystal is excellently joined to the Nd:YAG polycrystal without a space at the joining interface.

Example 4

Next, a laser oscillation experiment performed by use of each sample of an Nd:YAG polycrystal, a bonded body, and a joined body, and the result thereof will be described with reference to FIG. 13 and FIG. 14. The bonded body and the joined body are similar to those in Example 2. In this verification, a laser oscillation experimental system incorporating each sample was operated, and laser output for each case was measured.

Figure 13:
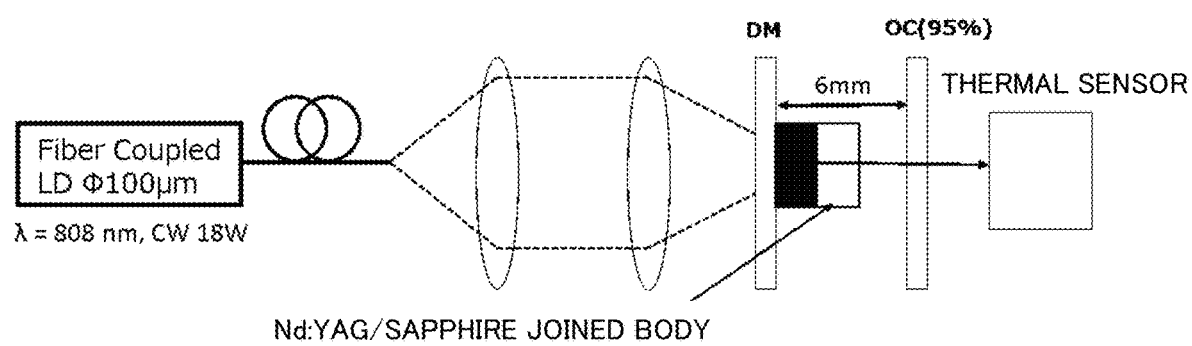
FIG. 13 is a diagram illustrating a configuration of a laser oscillation experimental system in Example 4.

FIG. 13 illustrates an example of the laser oscillation experimental system incorporating the joined body. The experimental system includes a pumping semiconductor laser (LD), an optical fiber, a lens system, an Nd:YAG/sapphire joined body, a dichroic mirror (DM), an output mirror (OC), and a thermal sensor. The LD emits continuous light (CW) having a wavelength λ of 808 nm and a laser output of 18 W. The optical fiber has a diameter of approximately 100 μm and transmits laser light from the LD toward the lens system. The lens system causes laser light supplied from the optical fiber to converge toward Nd:YAG. The thermal sensor receives laser light emitted from the OC and measures laser output.

Figure 14:
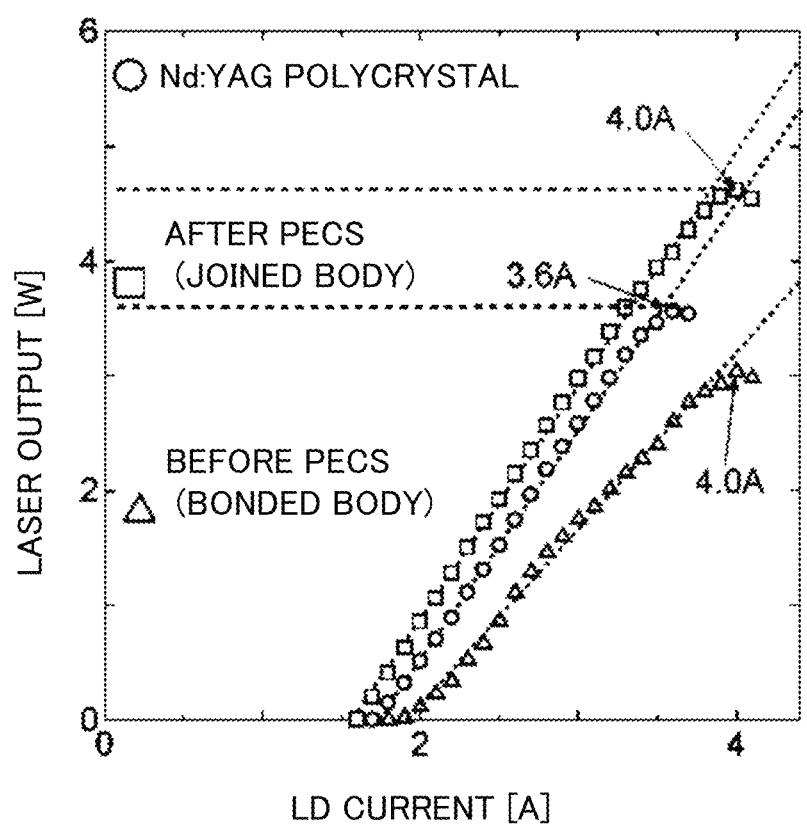
FIG. 14 is a graph illustrating a relation between LD current and laser output in Example 4.

FIG. 14 is a graph illustrating an input-output characteristic of the laser oscillation experimental system. The vertical axis of FIG. 14 represents laser output (W) output from the experimental system, and the horizontal axis represents current (A) applied to the LD. A symbol ○ in FIG. 14 represents a measured value when the Nd:YAG polycrystal is used, a symbol Δ represents a measured value when the bonded body is used, and a symbol □ represents a measured value when the joined body is used. The laser output when the Nd:YAG polycrystal was incorporated into the laser oscillation experimental system was 3.56 W, whereas the laser output when the joined body was incorporated into the laser oscillation experimental system was 4.62 W. Incorporation of the joined body into the laser oscillation experimental system increased laser output by approximately 30% compared with the case of the Nd:YAG polycrystal.

Further, the maximum pump current when the Nd:YAG polycrystal was used was 3.6 A, whereas the maximum pump current when the joined body was used was 4.0 A. Further, the maximum pump current when the bonded body was used was also 4.0 A. The above indicates that the maximum pump current increased due to a conduction cooling effect by sapphire contained in the joined body and the bonded body. It is further understood that when the joined body was used in the laser oscillation system, laser output also increased with increase in the maximum pump current.

From the above, it is confirmed in this verification that incorporation of an Nd:YAG polycrystal/sapphire monocrystal joined body into a laser oscillator enables increase in the maximum pump current that can be applied to a pumping light source and, as a result, enables increase in laser output.

Example 5

Next, an experiment for recognizing the lower limit of a diffusive entry length of an yttrium element at a joining interface in an Nd:YAG/sapphire joined body and the result thereof will be described with reference to FIG. 15. In this verification, one-dimensional concentration distribution of an yttrium element was acquired by irradiating a joining interface in an Nd:YAG/sapphire joined body produced under the same condition as that in Example 3 with an electron beam by an electron microscope and measuring fluorescent X-rays generated from the yttrium element. Subsequently, a diffusive entry length of the yttrium element was calculated, based on the one-dimensional concentration distribution of the yttrium element.

Figure 15:
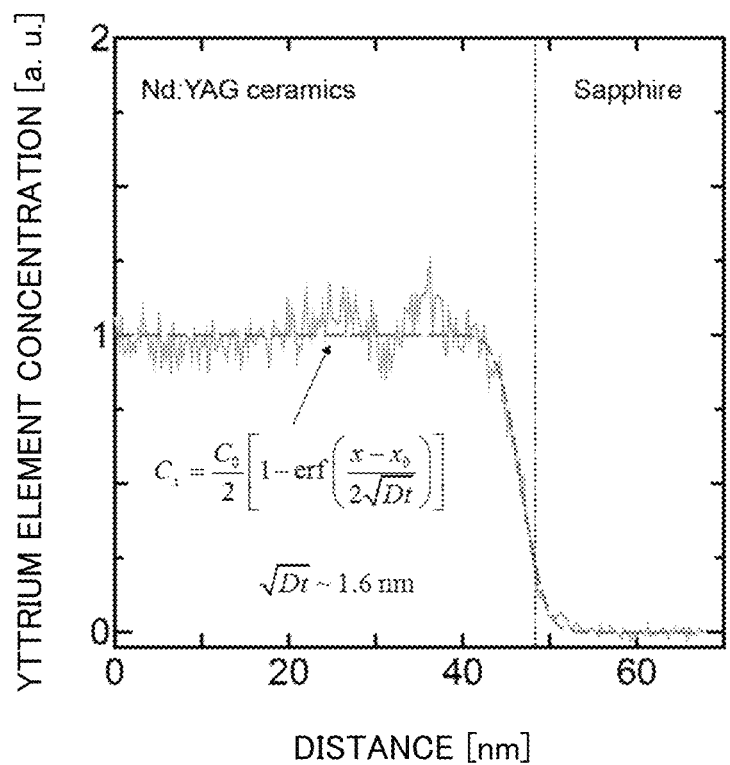
FIG. 15 is a graph illustrating a one-dimensional concentration distribution of an yttrium element acquired by electron microscope observation in Example 5.

FIG. 15 is a graph illustrating the one-dimensional concentration distribution of the yttrium element acquired by electron microscope observation. The vertical axis of FIG. 15 represents concentration (in any units) of the yttrium element, and the horizontal axis represents a distance (nm) from a predetermined position in Nd:YAG, the position not being affected by the joining. The concentration of the yttrium element is normalized to 1 in a part in Nd:YAG, the part not being affected by the joining. The left part separated by a dotted line in the vertical direction represents an Nd:YAG region, and the right part represents a sapphire monocrystal region.

A solid line in FIG. 15 represents a one-dimensional concentration distribution of the yttrium element, and a broken line is acquired by fitting the one-dimensional concentration distribution of the yttrium element represented by the solid line by Equation (1). Concentration $C_x$ of the yttrium element is normalized in FIG. 15, and therefore $C_0=1$. For example, a diffusive entry length is defined by $\sqrt{Dt}$ in Equation (1), and therefore the diffusive entry length $\sqrt{Dt}$ in FIG. 15 is 1.6 nm.

From the above, it is understood that a diffusive entry length of an yttrium element in an Nd:YAG/sapphire joined body is roughly 1.0 nm or greater. Further, calculation of a diffusive entry length using Equation (1) is applicable not only to the case of an Nd:YAG/sapphire joined body but also to a case of calculating a diffusive entry length of another joined body.

The present disclosure is not limited to the aforementioned embodiments, and modified examples described below may also apply.

Modified Examples

While a case of joining different types of materials (different-type materials) together have been described as an example in the aforementioned embodiments, the present disclosure is not limited thereto. The same-type materials may be joined together to form a joined body 10. For example, the same-type materials include a material acquired by doping a basic material with an active element, such as Nd:YAG for YAG.

While the optical material 11 has been sandwiched by a pair of cooling materials 12 in the aforementioned embodiments, the present disclosure is not limited thereto. For example, the cooling material 12 may be joined to one surface of the optical material 11, or the cooling material 12 may be joined to the outer peripheral surface of the optical material 11. Further, the cooling material 12 may be joined to the front of the optical material 11.

Figure 16:
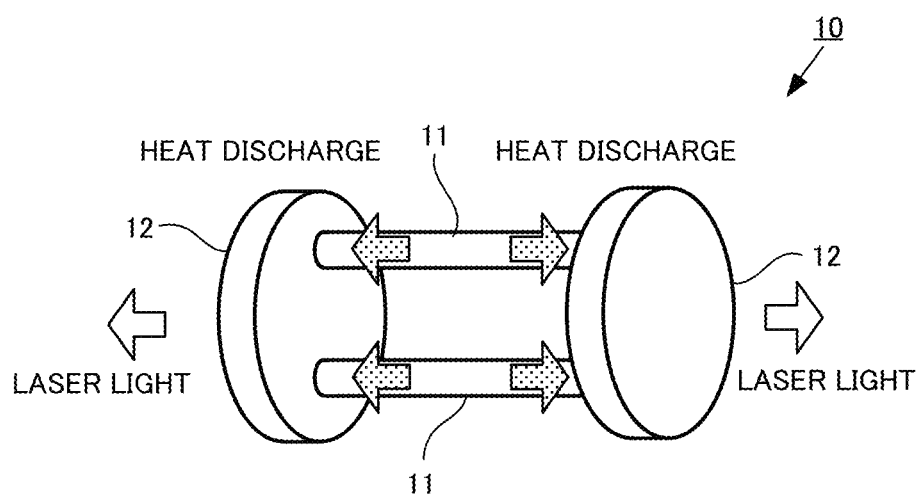
FIG. 16 is a perspective view illustrating a joined body according to a modified example of the present disclosure.

While the optical material 11 and the cooling material 12 are disk shapes having the same outer diameter in the aforementioned embodiments, the present disclosure is not limited thereto. The optical material 11 and the cooling material 12 may be disk-shaped members having different outer diameters. Further, for example, the optical material 11 and the cooling material 12 may be rectangular or polygonal plate-shaped members. Furthermore, the optical material 11 and the cooling material 12 may have shapes different from each other; and for example, a plurality of elongated cylindrical-shaped optical materials 11 may be joined to a pair of cooling materials 12 in such a way as to be sandwiched by the cooling materials 12, as illustrated in FIG. 16.

While the optical material 11 is formed of a polycrystal, and the cooling material 12 is formed of a monocrystal in the aforementioned embodiments, the present disclosure is not limited thereto. Each of the optical material 11 and the cooling material 12 may be any one of a monocrystal, a polycrystal, and a glass body as long as the material is capable of transmitting light. For example, the cooling material 12 may be formed of a polycrystal such as aluminum nitride.

While the joined body 10 is cylindrically formed in the aforementioned embodiments, the present disclosure is not limited thereto. For example, the joined body 10 may be cut in such a way that an end has Brewster's angle.

While the resonator 20 in the laser oscillator 1 includes the reflecting mirror 21 and the output mirror 22, and the pumping light sources 30 in the laser oscillator 1 and the laser amplifier 2 cause side pumping in the aforementioned embodiments, the present disclosure is not limited thereto. For example, anti-reflection (AR) coating or high-reflection (HR) coating may be applied to both ends of the joined body 10 in the laser oscillator 1, and a resonator may be formed in the joined body 10. Further, the pumping light sources 30 in the laser oscillator 1 and the laser amplifier 2 may be placed in such a way as to cause end pumping.

While the optical material 11 and the cooling material 12 are combined and then are installed in the manufacturing device 100 in the aforementioned embodiments, the present disclosure is not limited thereto. For example, the optical material 11 and the cooling material 12 may be installed at predetermined positions in the manufacturing device 100 in such a way as to be laid on top of each other in order, without being combined in advance.

While pressure and temperature of the optical material 11 and the cooling material 12 are gradually decreased after a predetermined time elapses in the aforementioned embodiments, the present disclosure is not limited thereto. For example, pressurization and heating of the optical material 11 and the cooling material 12 may be stopped after a predetermined time elapses. In this case, the materials may be cooled by natural air cooling, or the materials may be cooled by blowing air.

While the optical material 11 is a laser medium in the aforementioned embodiments, the present disclosure is not limited thereto. For example, the optical material 11 may be a magneto-optical material. For example, the magneto-optical material may be a material rotating a polarization plane by the Faraday effect for use in an optical isolator and a Faraday rotator. Further, the magneto-optical material may be a material elliptically polarizing reflected light by the magneto-optical Kerr effect for use in polarizer glass and the like.

Further, the optical material 11 may be a phosphor changing a color tone of laser light emitted from the laser oscillator. After entering an excited state by absorbing energy of light from the outside, the phosphor emits light having different energy in a process of returning to a ground state. The phosphor may be doped with an active element. The phosphor may be used for adjusting a color tone of a light emitting diode (LED) lamp.

While the manufacturing device 100 is operated in a vacuum in the aforementioned embodiments, the present disclosure is not limited thereto. For example, the manufacturing device 100 may be operated in an atmosphere of an inert gas such as argon and nitrogen.

Further, while the spontaneous emission absorber 14 is used in aforementioned Embodiment 3, the present disclosure is not limited thereto. For example, a scatterer scattering oscillation light around the optical material 11 may be joined in order to suppress parasitic oscillation.

While a case of applying the joined body 10 to the laser oscillator 1 and the laser amplifier 2 has been described as an example in the aforementioned embodiments, the present disclosure is not limited thereto. For example, the joined body 10 may be applied to a laser amplifier, an optical isolator, and a Faraday rotator.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2018-83878, filed on Apr. 25, 2018, the entire disclosure of which is incorporated by reference herein.

INDUSTRIAL APPLICABILITY

The joined body, the laser oscillator, the laser amplifier, and the joined body manufacturing method according to the present disclosure provide sufficient optical quality even when materials capable of transmitting light are combined and therefore are useful.

REFERENCE SIGNS LIST

1 Laser oscillator
2 Laser amplifier
10 Joined body
11 Optical material
12 Cooling material
13 Saturable absorber
14 Spontaneous emission absorber
20 Resonator
21 Reflecting mirror
22 Output mirror
30 Pumping light source
40 Amplified light source
100 Manufacturing device
110 Spacer
120 Punch
130 Die
140 Pulse current source

The invention claimed is:

1. A joined body comprising a first material and a second material that are capable of transmitting light and are joined together,
wherein, at a joining interface between the first material and the second material, the joined body is capable of transmitting light, and also an atom contained in the first material diffusively enters the second material in such a degree that an interference fringe is not generated in the joined body; and
wherein a diffusive entry length of an atom contained in the first material into the second material is in a range from approximately 1.0 nm to approximately 10 μm.

2. The joined body according to claim 1, wherein, assuming a wavelength 2 of laser light emitted from a laser interferometer used for measuring transmission wave surface precision to be 633 nm, transmission wave surface precision of the first material and the second material is approximately $\lambda$ or less.

3. The joined body according to claim 1, wherein the first material is a polycrystal, and the second material is a monocrystal.

4. The joined body according to claim 3, wherein the polycrystal is YAG or YAG doped with a rare-earth ion, and
the monocrystal is sapphire, aluminum nitride, gallium nitride, silicon carbide, or diamond.

5. The joined body according to claim 1, wherein the first material is a phosphor or a magneto-optical material, and the second material is a material having a thermal conductivity higher than that of the first material.

6. A laser oscillator comprising:
the joined body according to claim 1;
a resonator being placed in such a way as to sandwich the joined body and resonating light pumped by the joined body; and
a pumping light source emitting light to the joined body in such a way as to pump the joined body.

7. A laser amplifier comprising:
the joined body according to claim 1;
a pumping light source emitting light to the joined body in such a way as to pump the joined body; and
an amplified light source introducing light to the joined body in such a way that the light is amplified by the joined body.

8. The joined body of claim 1, wherein the diffusive entry length of an atom contained in the first material into the second material is in a range from approximately 1.0 nm to approximately 1.0 μm.

9. The joined body of claim 1, wherein the diffusive entry length of an atom contained in the first material into the second material is in a range from approximately 1.0 nm to approximately 100 nm.

10. The joined body of claim 1, wherein the diffusive entry length of an atom contained in the first material into the second material is in a range from approximately 1.0 nm to approximately 10 nm.

11. A method for manufacturing a joined body including a first material and a second material that are capable of transmitting light and are joined together, the joined body manufacturing method comprising:
a step of laying the first material and the second material on top of each other;
a step of pressurizing the first material and the second material at a predetermined pressure in such a way that the first material and the second material are closely adhered together;
a step of heating the first material and the second material to a predetermined temperature by supplying pulse current to the pressurized first material and the pressurized second material;
a step of, for a predetermined time, maintaining pressure applied to the first material and the second material at a predetermined pressure and maintaining temperature of the first material and the second material at a predetermined temperature; and
a step of gradually decreasing pressure applied to the first material and the second material, and temperature of the first material and the second material.

12. The joined body manufacturing method according to claim 11, wherein
 the predetermined pressure is in a range from approximately 1 MPa to approximately 10 GPa.

13. The joined body manufacturing method according to claim 11, wherein
 the predetermined temperature is in a range from approximately 900° C. to approximately 1500° C.

14. The joined body manufacturing method according to claim 11, wherein the predetermined time is in a range from approximately 5 minutes to approximately 20 hours.

* * * * *